(12) United States Patent
Blakely et al.

(10) Patent No.: US 7,793,043 B2
(45) Date of Patent: Sep. 7, 2010

(54) BUFFERED MEMORY ARCHITECTURE

(75) Inventors: Robert J. Blakely, Fort Collins, CO (US); Ray Woodward, Windsor, CO (US); Christian Petersen, Allen, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 306 days.

(21) Appl. No.: 11/509,449

(22) Filed: Aug. 24, 2006

(65) Prior Publication Data

US 2008/0052462 A1 Feb. 28, 2008

(51) Int. Cl.
*G06F 12/00* (2006.01)

(52) U.S. Cl. .................... 711/115; 711/5; 711/105; 711/170

(58) Field of Classification Search ............. 711/115, 711/5, 105, 170
See application file for complete search history.

(56) References Cited

U.S. PATENT DOCUMENTS

| | | | |
|---|---|---|---|
| 5,774,647 A | 6/1998 | Baynham et al. | |
| 6,092,146 A | 7/2000 | Dell et al. | |
| 6,381,663 B1 | 4/2002 | Morrison et al. | |
| 6,470,408 B1 | 10/2002 | Morrison et al. | |
| 6,618,266 B2 | 9/2003 | Blakely et al. | |
| 6,782,451 B2 | 8/2004 | Tseng | |
| 6,960,719 B2 | 11/2005 | Miksch et al. | |
| 7,023,719 B1 | 4/2006 | Hung et al. | |
| 7,079,446 B2 | 7/2006 | Murtagh et al. | |
| 7,254,663 B2 * | 8/2007 | Bartley et al. ............... | 710/305 |
| 2002/0172023 A1 | 11/2002 | Blakely et al. | |
| 2005/0082074 A1 | 4/2005 | Miksch et al. | |
| 2005/0259504 A1 | 11/2005 | Murtugh et al. | |
| 2006/0049500 A1 | 3/2006 | Goodwin | |
| 2006/0091529 A1 | 5/2006 | Wehrly, Jr. et al. | |
| 2007/0028144 A1 * | 2/2007 | Graham et al. ................ | 714/34 |
| 2007/0162670 A1 * | 7/2007 | Yang et al. .................. | 710/100 |
| 2008/0002447 A1 * | 1/2008 | Gulachenski et al. ......... | 365/51 |

* cited by examiner

Primary Examiner—Stephen C Elmore

(57) ABSTRACT

A memory architecture includes at least one unbuffered dual inline memory module (DIMM). At least one advanced memory buffer (AMB) provides an interface between the at least one DIMM and a host memory controller.

17 Claims, 3 Drawing Sheets

BUFFERED MEMORY ARCHITECTURE

BACKGROUND

Dual Inline Memory Modules (DIMMs) in various forms are used to provide memory expansion in a host computer. A DIMM typically includes a printed circuit board (PCB) with memory devices, such as DRAM or SDRAM, and supporting devices, such as ASICs, mounted to one or both sides. The DIMM is typically mounted in the host computer system by inserting a contact-bearing edge of the DIMM into a card edge connector on the host computer motherboard. This connection allows the host chipset, e.g., memory controller, to interface the DIMM.

Unregistered/unbuffered DIMMs do not include register components positioned between the memory devices and the host memory controller. Instead, the address and control signals from the memory controller are sent directly to every memory device on the DIMM. Unregistered/unbuffered DIMMs can be implemented in systems, such as personal computers, where scalability is of a lesser concern.

Registered DIMMs, sometimes referred to as buffered DIMMs, include additional register components, e.g., ASICS, positioned between the memory devices and the host memory controller. The register components buffer the address and control signals from the host memory controller, which helps reduce the loading and timing constraints of the host memory controller. This can help improve the scalability and reliability of the host memory.

Fully-Buffered Dual Inline Memory Module (FB-DIMM) technology is a relatively new memory architecture designed to allow for memory capacity growth commensurate with processor and I/O improvements. FB-DIMM technology replaces the traditional direct signaling interface between the host memory controller and the DRAM on the DIMM with two independent signaling interfaces—a parallel interface with the DRAM and a point-to-point serialized interface with the host memory controller. The FB-DIMM technology utilizes an advanced memory buffer (AMB) that provides a direct signaling interface between the serialized interface of the memory controller and the parallel interface of the DRAM.

The AMB interfaces with the memory controller and with DRAM ICs on the FB-DIMM to provide a parallel data stream to the DRAM ICs and a serialized data stream to the memory controller and other FB-DIMMs on the memory channel. In doing so, the AMBs utilize serialization/de-serialization (SerDes) technology to de-serialize the serialized data stream of the memory controller and serialize the parallel data stream of the DRAM ICs. The AMBs can support industry standards for the parallel interface with the DRAM ICs, such as double data rate (DDR), DDR2, and DDR3.

DETAILED DESCRIPTION

This disclosure relates generally to a fully-buffered dual inline memory architecture. More particularly, this disclosure relates to a memory architecture in which a fully-buffered dual inline memory configuration is achieved using unregistered/unbuffered Dual Inline Memory Modules (DIMMs).

Figure 1:
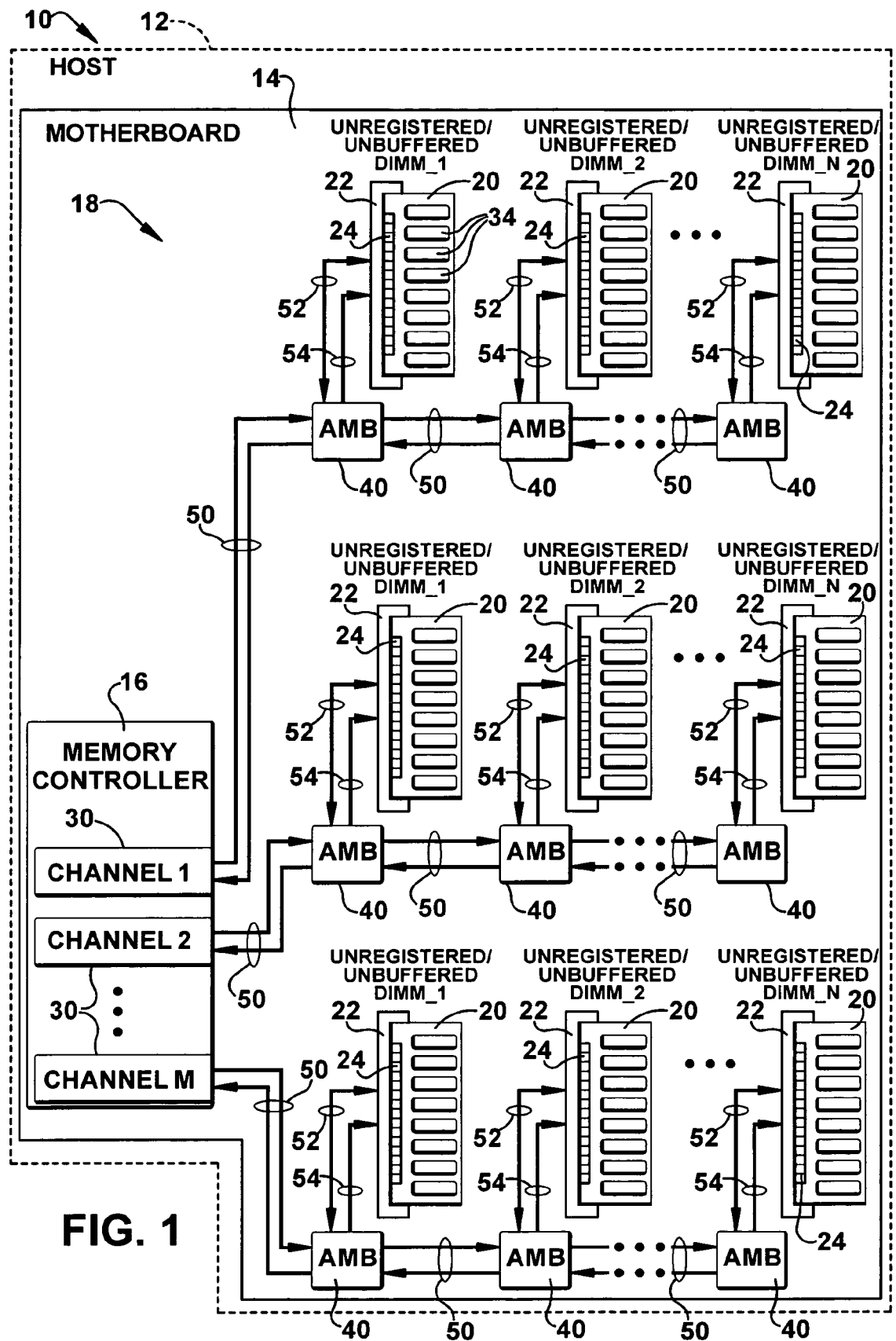
FIG. 1 is an example of a first embodiment of a system including a fully-buffered dual inline memory architecture.

FIG. 1 depicts an example embodiment of a system 10 that includes a host 12, such as a computer, e.g., a server. The host 12 includes a motherboard 14 and a memory controller 16 mounted to the motherboard. The system 10 also includes a memory architecture or memory 18 comprising at least one unregistered, unbuffered DIMM 20 mounted to the motherboard 14. The DIMMs 20 can be conventional, off-the-shelf, unregistered, unbuffered DIMMs, such as DDR, DDR2, or DDR3 DIMMs. As shown in FIG. 1, the motherboard 14 includes card edge connectors 22 into which contact bearing edges 24 of the DIMMs 20 are inserted. The memory controller 16 interfaces with the DIMMs 20 as described below.

The memory controller 16 can have multiple channels 30 (indicated at CHANNEL_1 to CHANNEL_M, where M is a positive integer), each of which can support multiple DIMMs 20 (indicated at DIMM_1 to DIMM_N, where N is a positive integer), to provide the host 12 with a configurable memory capacity. It will be appreciated that the scalability of the memory 18 is virtually unlimited. For example, in one particular configuration of the memory 18, the memory controller 16 can have six channels 30, each of which can handle eight DIMMs 20. Thus, in this particular example, if four gigabyte (GB) DIMMs are used, the memory 18 could be expandable or scalable up to 192 GB. Other configurations and different memory capacities can also be utilized.

In the system 10 of FIG. 1, the memory 18 also includes advanced memory buffers (AMBs) 40 that provide an interface between the memory controller 16 on motherboard 14 and memory components 34, e.g. DRAM integrated circuits (ICs), on the DIMMs 20. The AMBs 40 provide a point-to-point serialized interface, identified generally at 50, with the memory controller 16 and with other AMBs in the channel 30. The AMBs 40 also provide a parallel interface with the DRAM ICs 34 on its associated DIMM 20. The parallel interface includes a data portion, indicated generally at 52, and address/control/chip select portion, indicated generally at 54. The AMBs 40 can support industry standards for the parallel interface with the DRAM ICs 34, such as DDR, DDR2, and DDR3, and thus do not necessitate any alteration to the DRAM ICs. In the example of FIG. 1, the AMBs 40 are provided on a one-to-one basis, i.e., one AMB per DIMM 20.

The AMBs 40 are mounted to the motherboard 14, for example, by soldering or a socket mount. Socket mounted AMBs 40 can allow for adding or removing AMBs as corresponding DIMMs 20 are added or removed. The serialized interface 50 between the memory controller 16 and the AMBs 40, and the parallel interface 52,54 between the AMBs and the DIMMs 20, are provided via printed circuit traces (not shown) on the motherboard 14. The AMBs 40 implement a serialization/de-serialization (SerDes) interface between the data streams of the memory controller 16 and the DRAM ICs 34. The SerDes interface of the AMB 40 de-serializes the serialized data stream of the memory controller 16 for delivery to the DRAM ICs 40 and serializes the parallel data stream of the DRAM ICs for delivery to the memory controller.

The bus over which the AMBs 40 communicate with the memory controller 16 is a low pin count, high-speed, narrow serialized bus. This eliminates the need for the memory controller 16 to interface directly with a high pin count comparatively wide parallel bus, such as those encountered when using memory modules other than FB-DIMMs, such as registered DDR DIMMS. For example, the channel pin count for the serialized bus interface of the AMB 40 may be about 69 pins per channel, whereas the channel pin count for the parallel bus interface of registered DIMMs may be about 240 pins per channel. It can thus be appreciated that the implementing the serialized bus interface of the AMBs 40 can help free-up space on the motherboard 14 and reduces the complexity of the traces on the motherboard.

It will be appreciated that the system 10 of FIG. 1 provides a fully-buffered memory architecture in which a FB-DIMM performance can be achieved using standard, off-the-shelf, unregistered, unbuffered DIMMs 20 in conjunction with separate AMBs 40. This allows for expanding or scaling the memory capacity of the host 12 by simply installing the DIMMS 20, which are readily available and relatively cheap in comparison with FB-DIMMs, on an as-needed basis. Additional cost savings can be realized if the AMBs 40 can be provided on an as-needed basis via an installable/removable (e.g., socket mount) configuration.

Figure 2:
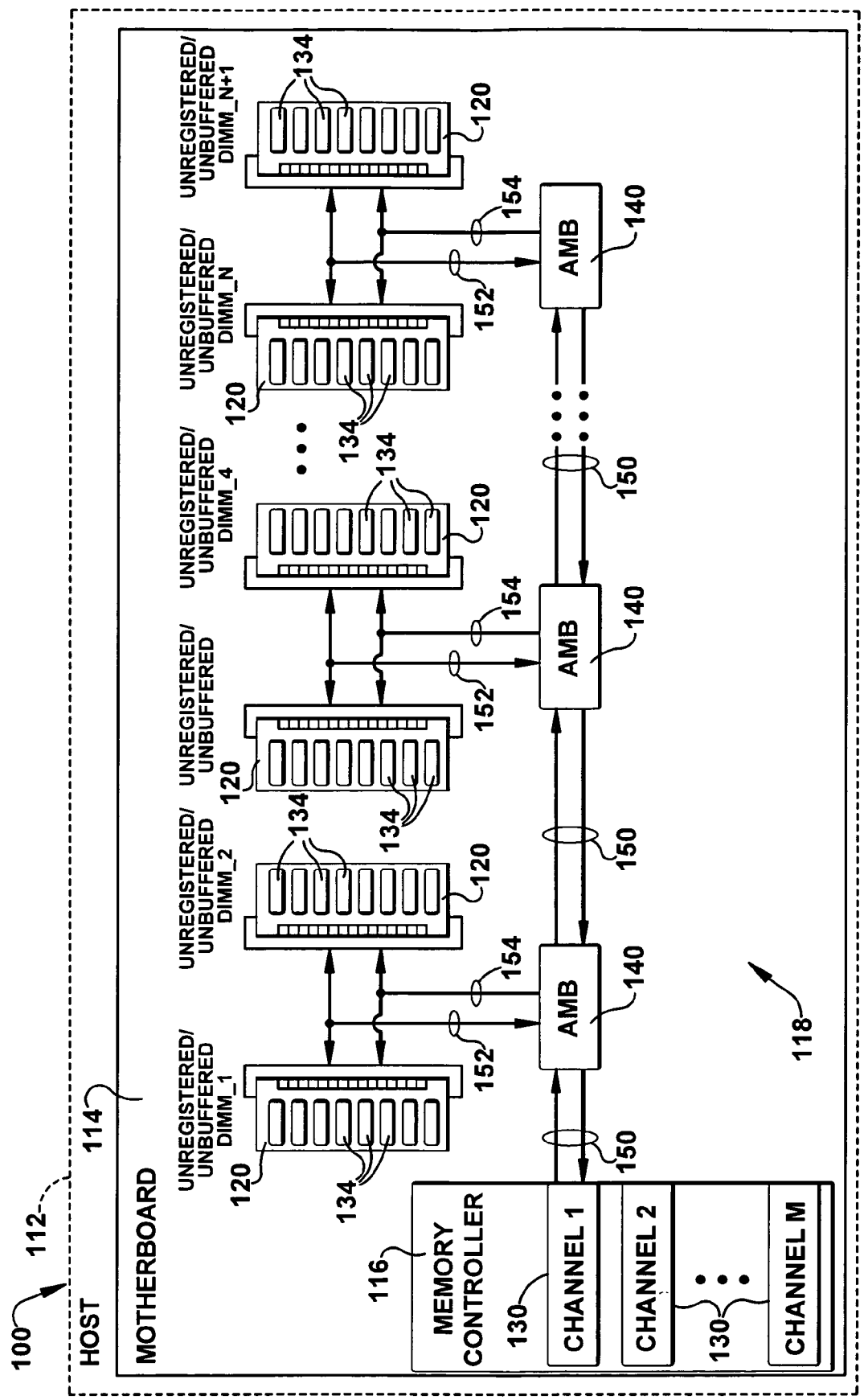
FIG. 2 is an example of a second embodiment of a system including a fully-buffered dual inline memory architecture.

FIG. 2 depicts an example embodiment of a system 100 includes a host 112 that includes a motherboard 114, a memory controller 116, and a memory architecture or memory 118. The memory 118 includes at least one unregistered, unbuffered DIMM 120 mounted to the motherboard. The DIMMs 120 can be conventional off-the-shelf DIMMs.

The memory controller 116 can have multiple channels 130 (indicated at CHANNEL_1 to CHANNEL_M, where M is a positive integer), each of which can support multiple DIMMs 120 (indicated at DIMM_1 to DIMM_N+1, where N is a positive integer), to provide the host 112 with a configurable memory capacity. It will be appreciated that the scalability of the memory 118 is virtually unlimited. For example, in one particular configuration of the memory 118, the memory controller 116 can have six channels 130, each of which can handle eight DIMMs 120. Thus, in this particular example, if four GB DIMMs are used, the memory 118 could be expandable or scalable up to 192 GB. Other configurations and different memory capacities can also be utilized.

In the system 100 of FIG. 2, the memory 118 also includes advanced memory buffers (AMBs) 140 that provide an interface between the memory controller 116 on the motherboard 114 and the DRAM ICs 134 on the DIMMs 120. The AMBs 140 provide a point-to-point serialized interface 150 with the memory controller 116 and with other AMBs in the channel 130. The AMBs 140 also provide parallel interfaces 152, 154 (e.g., DDR/DDR2/DDR3 interfaces) with the DRAM ICs 134 on the DIMM 120. The parallel interfaces include a data portion, indicated generally at 152, and address/control/chip select portion, indicated generally at 154. In the system 100 of FIG. 2, however, each AMB 140 provides the parallel interface 152, 154 for two DIMMs 120 (i.e., each AMB interfaces respective DIMMs on a one-to-two basis). The system 100 of FIG. 2 thus can reduce, by up to half, the number of AMBs 140 required to provide the serial 150 and parallel 152, 154 interfaces between the memory controller 116 and the DIMMs 120.

The AMBs 140 are mounted to the motherboard 114, for example, by soldering or a socket mount. The serialized interface 150 and parallel interface 152, 154 are provided via printed circuit traces (not shown) on the motherboard 114. The AMBs 140 provide a SerDes interface between the data streams of the memory controller 116 and the DRAM ICs 134, de-serializing the data stream of the memory controller and serializing the data stream of the DRAM ICs. The SerDes interface utilizes a low pin count, high-speed, narrow serialized bus interface with the memory controller 116. This eliminates the need for the memory controller 116 to interface directly with a high pin count comparatively wide parallel bus, such as those encountered when using memory modules other than FB-DIMMs, such as registered DDR DIMMS. This can help free-up space on the motherboard 14 and reduces the complexity of the traces on the motherboard.

It will be appreciated that the system 100 of FIG. 2 provides a fully-buffered memory architecture in which a FB-DIMM performance can be achieved using standard, off-the-shelf, unregistered, unbuffered DIMMs 120 in conjunction with separate AMBs 140. This allows for expanding or scaling the memory capacity of the host 112 by simply installing the off-the-shelf DIMMS 120, which are readily available and relatively cheap in comparison with FB-DIMMs, on an as-needed basis. Additional cost benefits can be realized if the AMBs 140 can be provided on an as-need basis via an installable/removable (e.g., socket mount) configuration.

Figure 3:
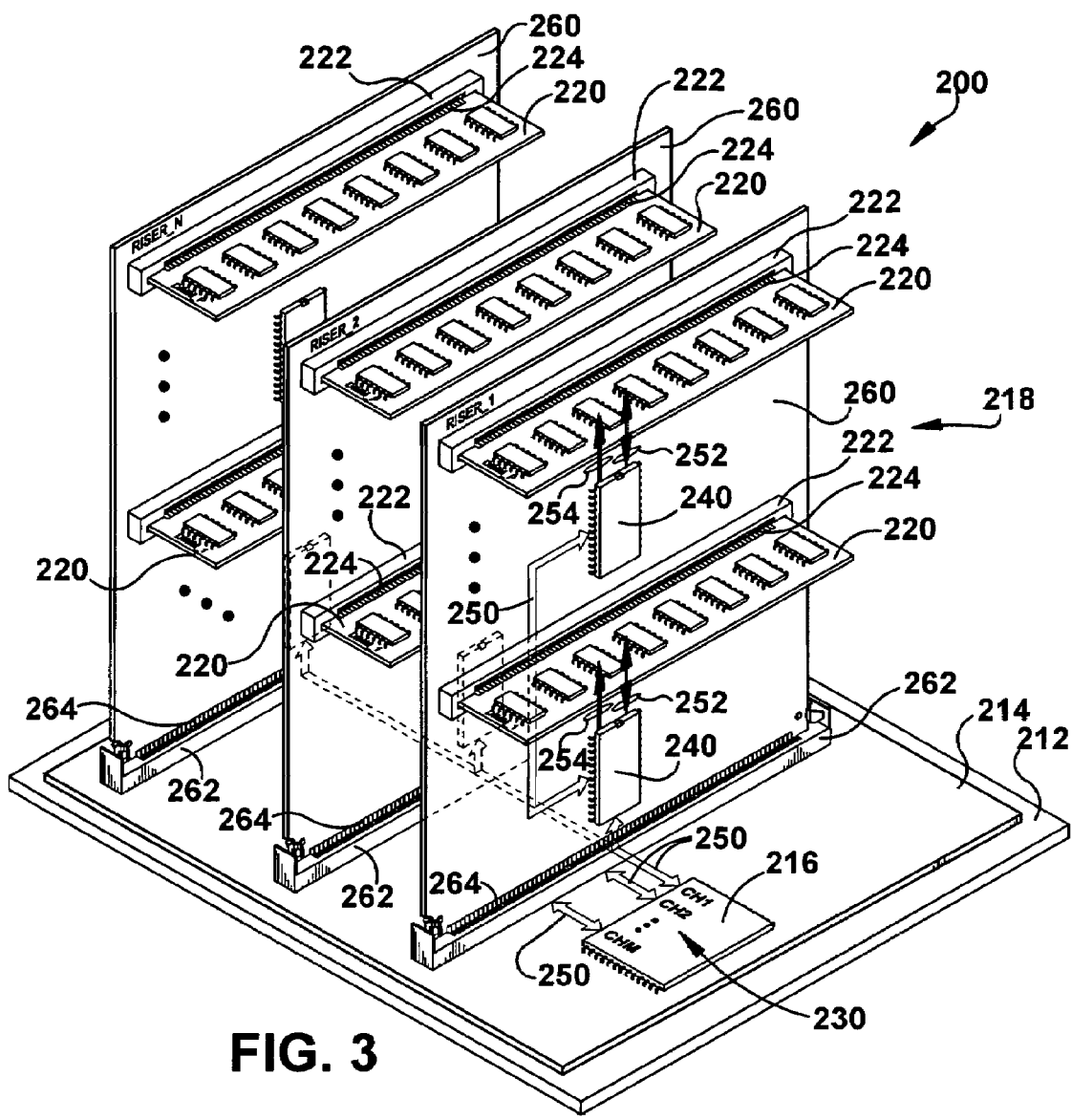
FIG. 3 is an example of a third embodiment of a system including a fully-buffered dual inline memory architecture.

FIG. 3 depicts an example embodiment of a system 200 includes a host 212 that includes a motherboard 214, a memory controller 216, and a memory architecture or memory 218 mounted to the motherboard. The memory 218 includes one or more riser boards or cards 260 mounted to the motherboard 214 via an edge connector 262 that receives a contact-bearing edge 264 of the riser card. In the system 200 of FIG. 3, the memory 218 also includes DIMMs 220 and AMBs 240 mounted to the riser card 260.

The riser card 260 includes a printed circuit board configured to provide the requisite power and interface signal paths between the AMBs 240 and the DIMMs 220 on the riser card, and between the AMBs and the memory controller 216 on the motherboard 214. The riser card 260 includes card edge connectors 222 into which contact bearing edges 224 of the DIMMs 220 are inserted. The AMBs 240 are mounted to the riser card 260, for example, by soldering or a socket mount.

As shown in the system 200 illustrated in FIG. 3, the motherboard 214 may include multiple card edge connectors 262 for supporting multiple riser cards 260. The riser cards 260 may include multiple card edge connectors 222 for supporting multiple DIMMs 220.

The memory controller 216 can have multiple channels 230 (indicated at CHANNEL_1 to CHANNEL_M, where M is a positive integer). Each channel 230 can support multiple DIMMs 220 (indicated at DIMM_1 to DIMM_P, where P is a positive integer) on one or more riser cards 260 (indicated at RISER_1 to RISER_N, where N is a positive integer). This provides the host 212 with memory 218 having virtually unlimited scalability. For example, any particular channel 230 may support multiple DIMMs 220 on a single riser card 260 or multiple DIMMs on multiple riser cards. As another example, a single riser card 260 may support more than one memory controller channel 230.

The AMBs 240 provide an interface between the memory controller 216 on the motherboard 214 and the DIMMs 220 on the riser card 260. The AMBs 240 provide a point-to-point serialized interface 250 with the memory controller 216 and with other AMBs in the channel 230. The AMBs 240 also provide parallel interfaces 252 (e.g., DDR/DDR2/DDR3 interfaces) with the DRAM ICs 234 on the DIMMs 220. The parallel interface includes a data portion, indicated generally at 252, and address/control/chip select portion, indicated generally at 254.

The serialized interface 250 and parallel interface 252, 254 are provided via the printed circuit traces (not shown) on the riser card 260 and motherboard 214. The AMBs 240 provide a SerDes interface between the data streams of the memory controller 216 and the DRAM ICs 234, de-serializing the data stream of the memory controller and serializing the data stream of the DRAM ICs. The SerDes interface utilizes a low pin count, high-speed, narrow serialized bus interface with the memory controller 216, which eliminates the high pin count, wide parallel bus used by non-FB-DIMM memory configurations.

In the system 200 of FIG. 3, the memory 218 is illustrated in a configuration in which the AMBs 240 interface with DIMMs 220 on a one-to-one basis similar to that described above in regard to the memory 18 in the system 10 of FIG. 1. It will, however, be appreciated that the system 200 could be configured such that the AMBs 240 interface with the DIMMs 220 on a one-to-two basis, as described above in regard to the memory 118 in the system 100 of FIG. 2.

It will be appreciated that the system 200 of FIG. 3 provides a fully-buffered memory architecture in which FB-DIMM performance is achieved using standard, off-the-shelf, unregistered, unbuffered DIMMs 220 in conjunction with separate AMBs 240. This allows for expanding or scaling the memory capacity of the host 212 by simply installing the DIMMS 220, which are readily available and relatively cheap in comparison with FB-DIMMs, on an as-needed basis. Additional cost benefits can be realized if the AMBs 240 can be are provided on an as-needed basis via an installable/removable (e.g., socket mount) configuration.

Figure 4:
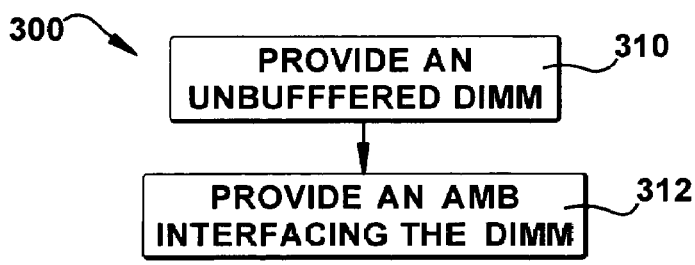
FIG. 4 is an example of a method for constructing a system including a fully-buffered dual inline memory architecture.

In view of the foregoing structural and functional features described above, certain methods will be better appreciated with reference to FIG. 4. It is to be understood and appreciated that the illustrated actions, in other embodiments, may occur in different orders and/or concurrently with other actions. Moreover, not all illustrated features may be required to implement a method.

FIG. 4 depicts an example embodiment of a method 300 that can be employed to construct a system comprising a memory architecture, such as that shown and described herein. The method 300 of FIG. 4 begins at 310 at which an unbuffered DIMM is provided. The DIMM can, for example, be connected directly to a host motherboard via a card edge connector or can be connected to the motherboard via a riser card, as described above. At 312, an AMB is provided to establish an interface between the DIM and the host memory controller. The AMB can be installed directly on the host motherboard or on the riser card.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A memory architecture comprising:
    at least one unbuffered dual inline memory module (DIMM); and
    at least one advanced memory buffer (AMB) for providing an interface between the at least one DIMM and a host memory controller, wherein the at least one AMB and the at least one DIMM are separate individually mounted components.

2. The memory architecture recited in claim 1, further comprising:
    a motherboard; and
    a card edge connector mounted to the motherboard, the card edge connector receiving a contact-bearing edge of the at least one DIMM, the at least one AMB being mounted to the motherboard.

3. The memory architecture recited in claim 1, further comprising:
    a motherboard;
    a first card edge connector mounted to the motherboard; and
    a riser card having a contact bearing edge receivable in the first card edge connector, the at least one DIMM and the at least one AMB being on the riser card.

4. The memory architecture recited in claim 3, wherein the riser card comprises a second card edge connector for receiving a contact-bearing edge of the at least one DIMM.

5. The memory architecture recited in claim 1, further comprising:
    a serialized bus linking the at least one AMB and the memory controller; and
    a parallel bus linking the at least one AMB to the at least one DIMM.

6. The memory architecture recited in claim 1, wherein the at least one AMB interfaces the at least one DIMMs on a one-to-one basis.

7. The memory architecture recited in claim 1, wherein the at least one AMB interfaces the at least one DIMMs on a one-to-two basis.

8. A system comprising:
    a host comprising a memory controller;
    at least one unbuffered DIMM; and
    at least one advanced memory buffer (AMB) for providing an interface between the at least one DIMM and the host memory controller, wherein the at least one AMB and the at least one DIMM are separate components individually mounted to the host.

9. The system recited in claim 8, wherein the host comprises a motherboard and a card edge connector mounted to the motherboard, the card edge connector receiving a contact-bearing edge of the at least one DIMM, the at least one AMB being mounted to the motherboard.

10. The system recited in claim 8, wherein the host comprises a motherboard and a first card edge connector mounted to the motherboard, the system further comprising a riser card having a contact bearing edge receivable in the first card edge connector, the at least one DIMM and the at least one AMB being mounted to the riser card.

11. The system recited in claim 10, wherein the riser card comprises a second card edge connector for receiving a contact-bearing edge of the at least one DIMM.

12. The system recited in claim 8, further comprising:
    a serialized bus linking the at least one AMB to the memory controller; and
    a parallel bus linking the at least one AMB to the at least one DIMM.

13. A method for providing memory for a host that includes a memory controller, the method comprising:
    providing at least one unbuffered DIMM;
    providing at least one AMB for interfacing between the at least one DIMM and the host memory controller; and
    mounting the at least one DIMM and the at least one AMB to the host as separate individually mountable components.

14. The method recited in claim 13, wherein the host comprises a motherboard, the memory controller being mounted to the motherboard, the method further comprising:
    mounting the at least one AMB on the motherboard;
    providing a card edge connector on the motherboard; and
    connecting a contact-bearing edge of the at least one DIMM to the card edge connector.

15. The method recited in claim 13, wherein the host comprises a motherboard, the memory controller being mounted to the motherboard, the method further comprising:
  providing a card edge connector on the motherboard;
  connecting a contact-bearing edge of a riser card to the card edge connector;
  mounting the at least one DIMM on the riser card; and
  mounting the at least one AMB on the riser card.

16. The method recited in claim 15, wherein the step of mounting the at least one DIMM on the riser card comprises:
  providing a card edge connector on the riser, card; and
  connecting a contact-bearing edge of the at least one DIMM to the card edge connector on the riser card.

17. The method recited in claim 13, further comprising:
  providing a serialized bus interface between the at least one AMB and the memory controller; and
  providing a parallel bus interface between the at least one AMB and the at least one DIMM.

* * * * *

UNITED STATES PATENT AND TRADEMARK OFFICE
CERTIFICATE OF CORRECTION

| | | |
|---|---|---|
| PATENT NO. | : 7,793,043 B2 | Page 1 of 1 |
| APPLICATION NO. | : 11/509449 | |
| DATED | : September 7, 2010 | |
| INVENTOR(S) | : Robert J. Blakely et al. | |

It is certified that error appears in the above-identified patent and that said Letters Patent is hereby corrected as shown below:

In column 8, line 1, in Claim 16, delete "riser, card;" and insert -- riser card; --, therefor.

Signed and Sealed this
First Day of March, 2011

David J. Kappos
*Director of the United States Patent and Trademark Office*